United States Patent [19]
Mitsui

[11] Patent Number: 5,999,009
[45] Date of Patent: Dec. 7, 1999

[54] SEMICONDUCTOR INTEGRATED CIRCUIT WITH AN INTERNAL VOLTAGE GENERATING CIRCUIT REQUIRING A REDUCED OCCUPIED AREA

[75] Inventor: Katsuyoshi Mitsui, Hyogo, Japan

[73] Assignee: Mitsubishi Denki Kabushiki Kaisha, Tokyo, Japan

[21] Appl. No.: 08/901,244

[22] Filed: Jul. 25, 1997

[30] Foreign Application Priority Data

Mar. 7, 1997 [JP] Japan ................................ 9-053577(P)

[51] Int. Cl.$^6$ ................................................. G01R 31/26
[52] U.S. Cl. ............................................ 324/765; 324/763
[58] Field of Search ................................... 324/763, 765; 327/536, 566; 331/10, 57

[56] References Cited

U.S. PATENT DOCUMENTS

| | | | |
|---|---|---|---|
| 5,039,893 | 8/1991 | Tomiaswa | 307/597 |
| 5,124,574 | 6/1992 | Ibaraki | 327/566 |
| 5,208,557 | 5/1993 | Kersh, III | 331/57 |
| 5,264,808 | 11/1993 | Tanaka | 331/57 |

FOREIGN PATENT DOCUMENTS 60-193369  10/1985  Japan .
63-224665  9/1988  Japan .

OTHER PUBLICATIONS

"A 35ns 64Mb DRAM using On–Chip boosted Power Supply", Doug–Jae Lee et al.., 1992 Symposium on VLSI Circuits Digest of Technical Papers, pp. 64–65 (month unavailable.

"Applications of a High–Voltage Pumped Supply for Low–Power DRAM", R.C. Foss et al.., 1992 Symposium on VLSI Circuits Digest of Technical papers, pp. 106–107 (month unavailable).

*Primary Examiner*—Josie Ballato
*Assistant Examiner*—Minh Tang
*Attorney, Agent, or Firm*—McDermott, Will & Emery

[57] ABSTRACT

A semiconductor integrated circuit includes a charge pump for issuing an internal power supply voltage higher than an external power supply voltage, two level detectors for detecting a magnitude of the internal power supply voltage issued from the charge pump, and a composite ring oscillator including two ring oscillators connected to these level detectors and having different oscillation frequencies, respectively. Depending on the magnitude of the internal power supply voltage issued from the charge pump, the signals generated by the ring oscillators are selectively issued to the charge pump.

18 Claims, 12 Drawing Sheets

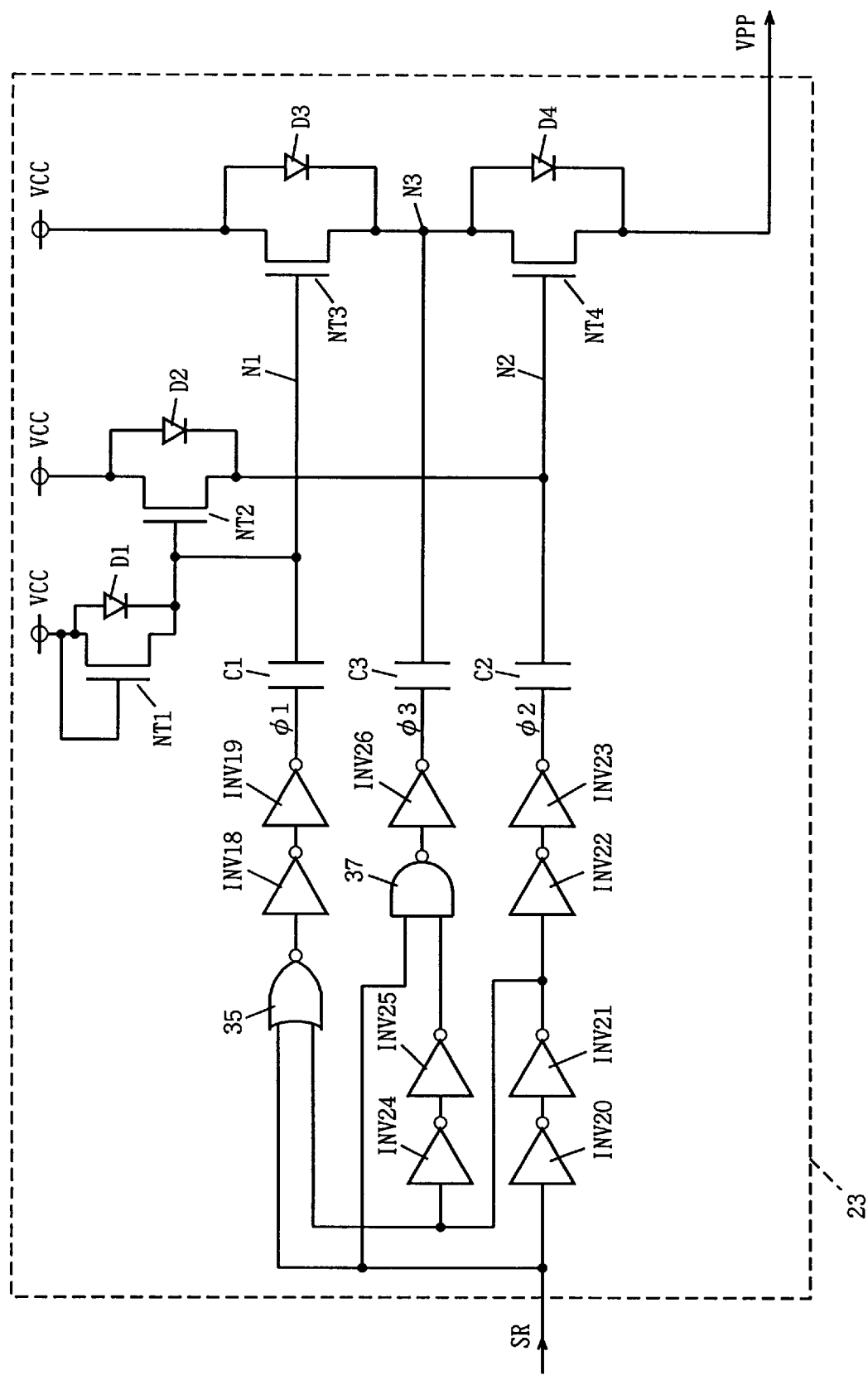
F I G. 3

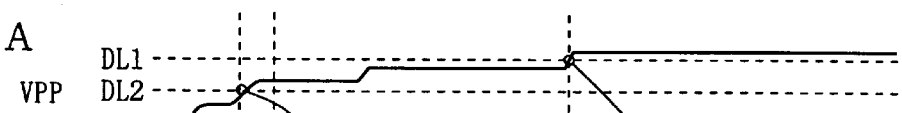
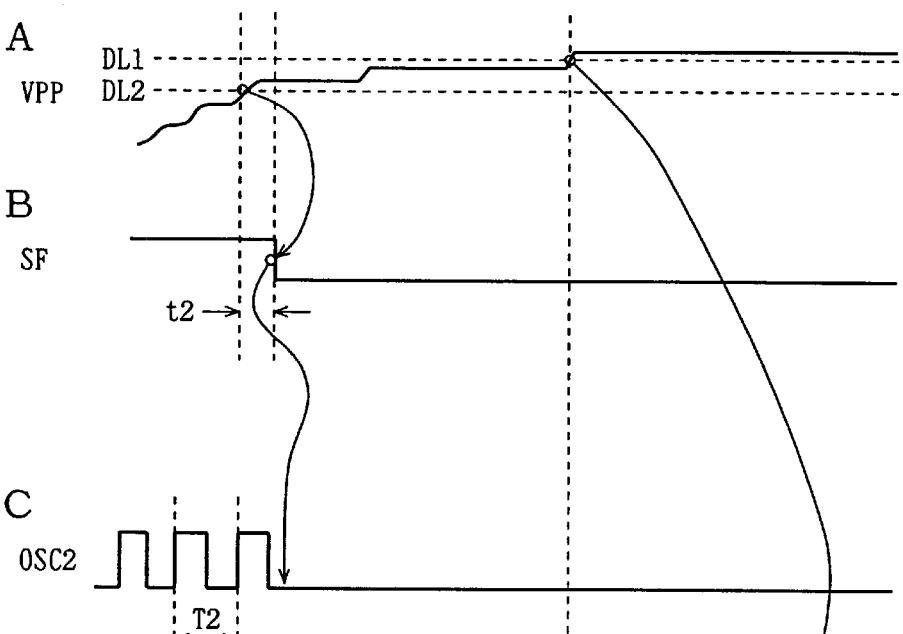
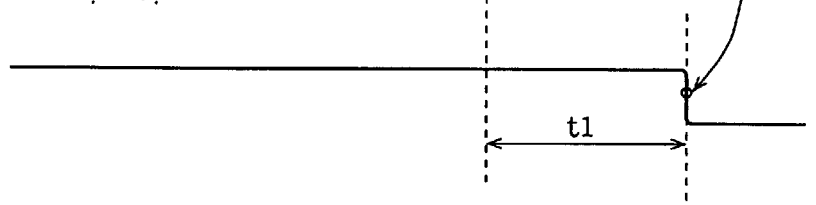
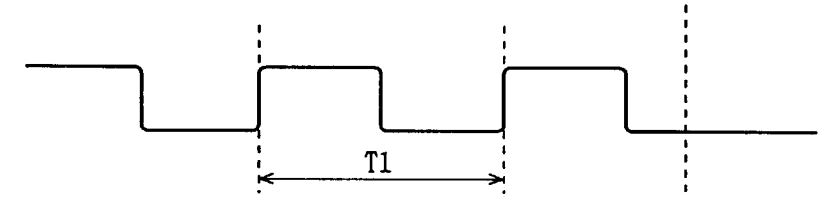

SEMICONDUCTOR INTEGRATED CIRCUIT WITH AN INTERNAL VOLTAGE GENERATING CIRCUIT REQUIRING A REDUCED OCCUPIED AREA

This application is related to the copending U.S. patent application Ser. No. 08/688,077 which was filed on Jul. 29, 1996 and was assigned to the same assignee as the present invention.

BACKGROUND OF THE INVENTION

1. Field of the Invention

The present invention relates to semiconductor integrated circuits, and in particular to semiconductor integrated circuits which includes a circuit for generating a voltage higher than an externally supplied power supply voltage and a circuit for generating a negative voltage lower than a ground voltage.

2. Description of the Background Art

Present MOS semiconductor integrated circuits have boosted power supply circuit systems which generate an internal power supply voltage higher than an externally supplied power supply voltage and internally supply the same into the semiconductor integrated circuits so that high-level signals may be transmitted without lowering the level even if N-type MOSFETs are used.

Also, the MOS semiconductor integrated circuits have power supply circuit systems for generating an internal voltage lower than an externally supplied ground voltage and internally supply the same to the semiconductor integrated circuits so that a fast operation with a reduced power consumption may be achieved by reducing a coupling capacity at a drain node, and an operation margin may be increased by reducing a variation in threshold voltage due to a substrate effect.

The power supply circuit systems are required to detect a variation in the internal voltage due to an operation current and a leak current and thereby maintain the internal voltage within a range which can maintain the semiconductor integrated circuit at the normal state.

The variation in internal voltage is caused by flow of at least 2-digit number of currents including a current smaller than 100 nA caused by the semiconductor solid-state properties during standby and variation in performance due to manufacturing as well as a current on the order of 10 $\mu$A caused by a circuit structure such as a bias current. When currents including up to an operation current on the order of 10 mA during the circuit operation are taken into consideration, the above variation in internal voltage is caused by flow of up to 5-digit number of currents.

FIG. 14 shows a structure of a boosted power supply circuit in the prior art having two detection levels. This circuit includes an output node N1, a first system circuit 1 provided for suppressing lowering from a set voltage and having a small current supply capacity per time, and a second system circuit 9 connected in parallel with first system circuit 1 and provided for rapid restoration from lowering from the set voltage.

First system circuit 1 includes a level detector 3 which has a detection level near the set voltage and has a response time t1 longer than a level detector 11, a ring oscillator 5 having a longer period T1 than a ring oscillator 13, and a charge pump 7 having a current supply capacity Q1 per period. In a continuous operation, the current supply capacity per time is equal to Q1/T1.

Second system circuit 9 includes level detector 11 which has a detection level at a voltage lower than the set voltage of level detector 3 and has a response time t2 shorter than level detector 3, a ring oscillator 13 having a shorter period T2 than ring oscillator 5, and a charge pump 15 of a current supply capacity Q2 per period. In the continuous operation, the current supply capacity per time is Q2/T2, and is larger than current supply capacity Q1/T1 of first system circuit.

FIG. 15 is a circuit diagram showing specific structures of ring oscillators 5 and 13. As shown in FIG. 15, ring oscillators 5 and 13 have the same circuit structure, and each include an NAND circuit 16 and inverters INV1-INV5 connected in series. However, MOS transistors forming inverters INV1–INV4 included in ring oscillator 5 have gate lengths sufficiently longer than those of MOS transistors of inverters INV1–INV4 included in ring oscillator 13. Also, period T1 of ring oscillator 5 is longer than period T2 of ring oscillator 13.

An operation of the boosted power supply circuit described above will now be described below.

Owing to electric charges Q accumulated in a decouple capacity Cd, the potential on output node N1 is maintained at a potential VPP (=Q/Cd):

During standby, charges Q accumulated in decouple capacitor Cd are lost due to a leak current which is unavoidable due to the semiconductor solid-state properties and a leak current which is unavoidable due to the circuit structures, so that potential VPP lowers. During operation, charges Q are lost and potential VPP lowers due to the operation current of circuits.

The leak current during standby in each semiconductor integrated circuit always exhibits substantially constant characteristics. However, the current during operation has such a feature that the current significantly varies depending on an operation pattern inside the semiconductor integrated circuit in contrast to the leak current during standby.

Therefore, the boosted power supply circuit having the two detection levels operates in such a manner that only first system circuit 1 having level detector 3 of response time t1 operates intermittently to maintain potential VPP on output node N1 and second system circuit 9 does not operate, when the operation or leak current is small and the charges which are lost per time are smaller than Q1/T1.

When the operation current or leak current further increases, the charges which are lost per time increase, so that current supply capacity Q1/T1 attained only by the continuous operation of the first system circuit 1 cannot maintain potential VPP set on output node N1, and therefore potential VPP lowers to the detection level of level detector 1.

When level detector 11 of response time t2 detects lowering of potential VPP on output node N1, ring oscillator 13 having a shorter period T2 than ring oscillator 5 will start the operation after elapsing of response time t2. In this manner, second system circuit 9 having current supply capacity Q2/T2 per time operates continuously for restoration from lowered potential VPP.

When potential VPP on output node N1 rises to the detection level of level detector 11 owing to the above continuous operation, the ring oscillator 13 will stop after elapsing of response time t2. However, at the time of this step, potential VPP is not yet completely restored.

The continuous operation of the first system circuit 1 is further required for completely restoring potential VPP to the set level.

In the above conventional boosted power supply circuit, second system circuit 9 is essentially required, for rapid restoring the lowered potential on output node N1, to detect lowering of potential VPP on output node N1 in a short response time t2 and operate charge pump 15 having large current supply capacity Q2/T2 per time with short period T2. It is not necessary to set current supply capacity Q2 per period to a large value.

If switching from the operation of second system circuit 9 to the operation of first system circuit 1 can be performed rapidly, potential VPP on output node N1 can be ultimately restored rapidly from the lowered state.

Although the foregoing description has been given on the boosted power supply circuit, the same is true with respect to a power supply circuit generating a negative voltage.

SUMMARY OF THE INVENTION

An object of the invention is to provide a semiconductor integrated circuit provided with a power supply circuit which can generate an internal voltage similar to the prior art but requires a small occupied area.

According to a first aspect, a semiconductor integrated circuit includes an internal voltage generating circuit for generating an internal voltage based on an external voltage in response to a period signal, a plurality of detecting circuits having different predetermined detection levels and being operable to issue detection signals when the internal voltage issued from the internal voltage generating circuit reach the predetermined detection levels, respectively, a plurality of period signal supply circuits provided correspondingly to the plurality of detecting circuits for issuing the period signals having different frequencies, respectively, and a select circuit for selectively supplying to the internal voltage generating circuit one of the plurality of period signals issued from the plurality of period signal supply circuits in response to the detection signal issued from the plurality of detecting circuits.

Accordingly, the invention has such a major effect that an area occupied by the circuit generating the internal voltage can be reduced, and therefore a semiconductor chip area can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram showing a structure of a charge pump shown in FIG. 1 in a boosted power supply circuit system;

FIGS. 6A–6F are timing charts for showing an operation of the semiconductor integrated circuit of the embodiment 1 of the invention;

DESCRIPTION OF THE PREFERRED EMBODIMENTS

Embodiments of the invention will be described below with reference to the drawings. In the figures, the same numbers indicate the same or similar portions.

[Embodiment 1]

Figure 1:
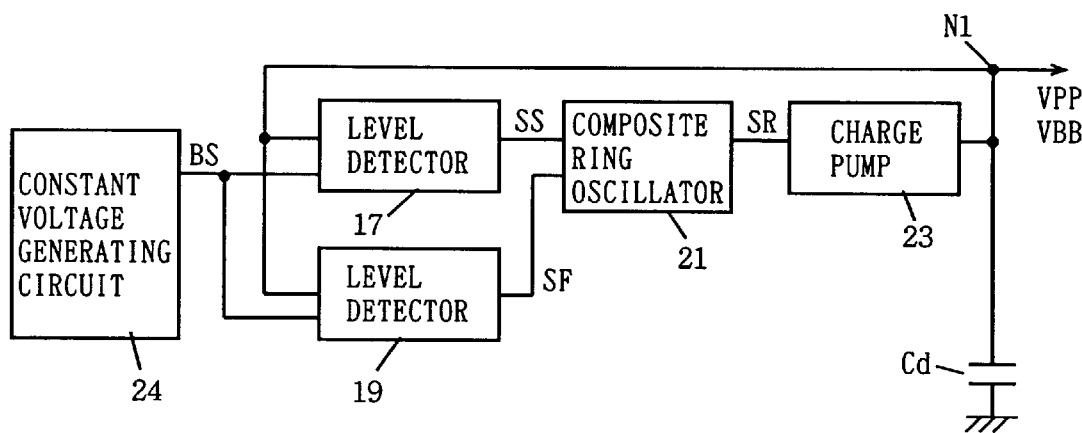
FIG. 1 shows a structure of a power supply circuit system of a semiconductor integrated circuit according to an embodiment of the invention.

FIG. 1 shows a structure of a boosted power supply circuit included in a semiconductor integrated circuit according to an embodiment 1 of the invention.

As shown in FIG. 1, the boosted power supply circuit includes an output node N1, a charge pump 23 which generates an internal power supply voltage higher than an external power supply voltage and supplies the same to output node N1, level detectors 17 and 19 which are connected to output node N1 and have different detection levels DL1 and DL2 for detecting a magnitude of the internal power supply voltage issued from the charge pump 23, respectively, a constant voltage generating circuit 24 for supplying a constant analog voltage BS to level detectors 17 and 19, and a composite ring oscillator 21 including two ring oscillators which are connected to level detectors 17 and 19 and oscillate at different frequencies, respectively. The composite ring oscillator 21 operates depending on the magnitude of the internal power supply voltage issued from the charge pump 23, and thereby selectively supplies two signals generated by the above two ring oscillators to charge pump 23.

Figure 2:
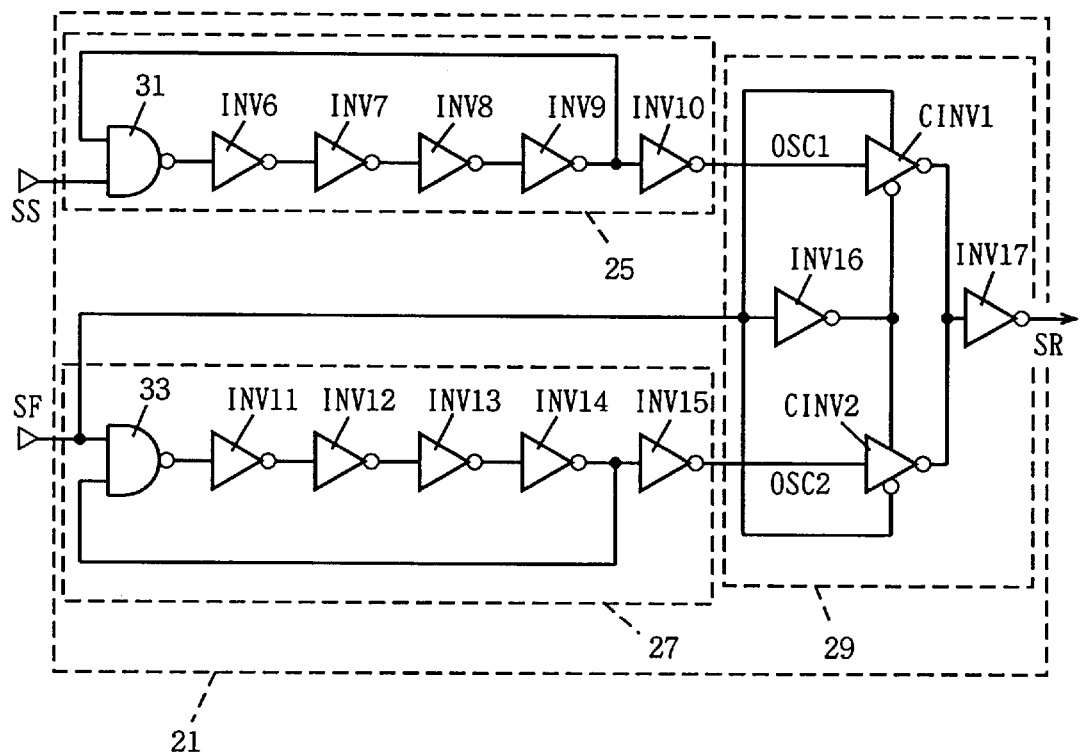
FIG. 2 is a circuit diagram showing a structure of a composite ring oscillator shown in FIG. 1 of the embodiment 1 of the invention.

FIG. 2 is a circuit diagram showing a specific structure of composite ring oscillator 21. As shown in FIG. 2, composite ring oscillator 21 includes a ring oscillator 25 oscillating with long period T1, a ring oscillator 27 oscillating with short period T2, and a select circuit 29 which selectively sends output signals OSC1 and OSC2 of ring oscillators 25 and 27 to the charge pump as a signal SR.

Ring oscillator 25 includes an NAND circuit 31 and inverters INV6–INV10 similarly to ring oscillator 5 in the prior art. Likewise, ring oscillator 27 includes an NAND circuit 33 and inverters INV11–INV15 similarly to the ring oscillator 13 in the prior art. However, MOS transistors included in inverters INV6–INV10 have sufficiently longer gate lengths than MOS transistors included in inverters INV11–INV15, although these MOS transistors have the same circuit structures. Ring oscillator 25 oscillates with a longer period than ring oscillator 27. Ring oscillators 25 and 27 are activated by receiving, on NAND circuits 31 and 33, detection signals SS and SF at a high level from level detectors 17 and 19, respectively.

Select circuit 29 includes an inverter INV16 receiving output signal SF from level detector 19, two clocked inverters CINV1 and CINV2, and an inverter INV17 receiving output signals from clocked inverters CINV1 and CINV2 and issuing signal SR.

FIG. 3 is a circuit diagram showing a specific structure of charge pump 23 shown in FIG. 1.

As shown in FIG. 3, charge pump 23 has a structure similar to those of charge pumps 7 and 15 in the prior art, and more specifically includes inverters INV20–INV26, an NOR circuit 35, an NAND circuit 37, capacitors C1–C3, diodes D1–D4, N-channel MOS transistors NT1–NT4 and nodes N1–N3.

Figure 4:
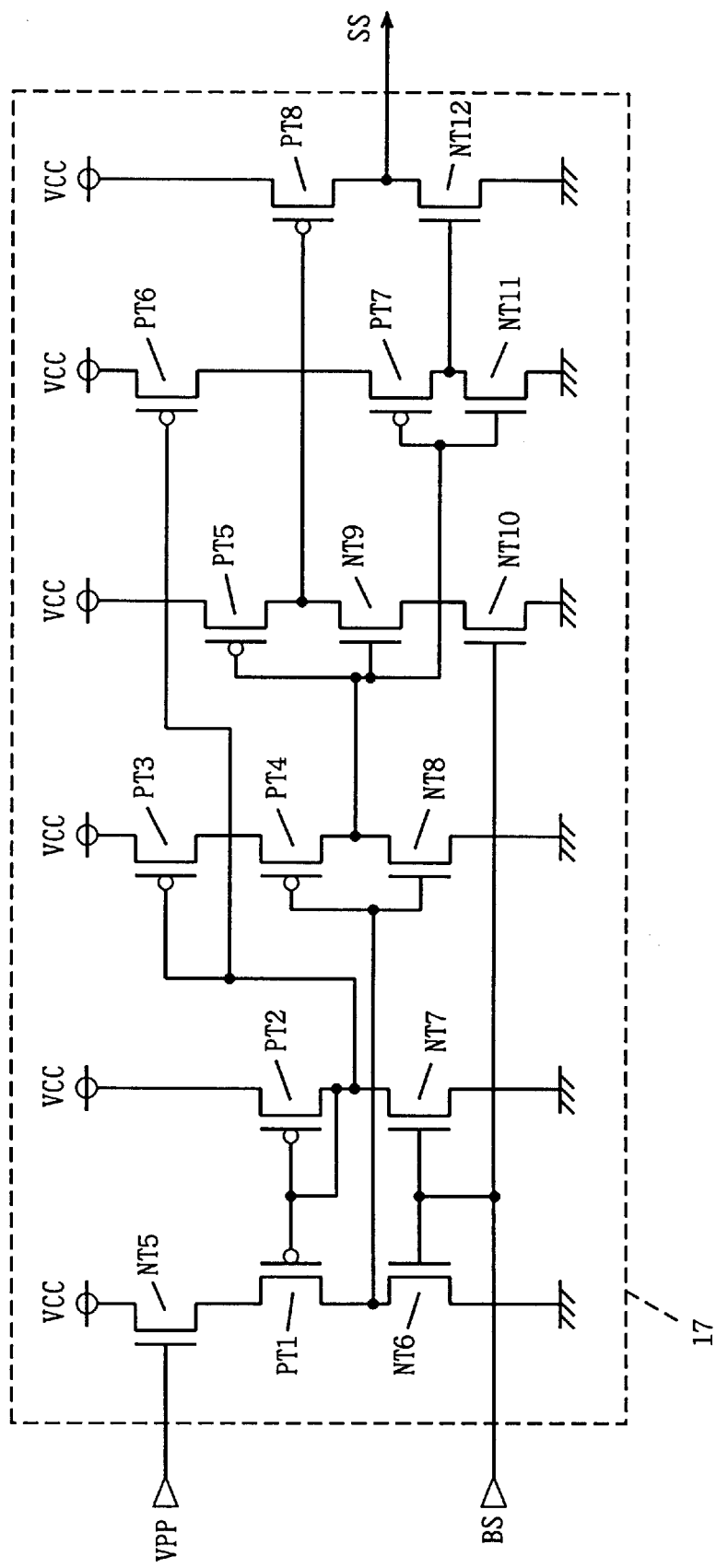
FIG. 4 is a circuit diagram showing a structure of a level detector shown in FIG. 1 in a boosted power supply circuit system.

FIG. 4 is a circuit diagram showing a specific structure of level detector 17 shown in FIG. 1. Level detector 19 has the same circuit structure as level detector 17, and both level detectors 17 and 19 have structures similar to those of level detectors 3 and 11 in the prior art. Level detector 17 includes N-channel MOS transistors NT5–NT12 and P-channel MOS transistors PT1–PT8.

Detection levels DL1 and DL2 of level detectors 17 and 19 depend on magnitudes of threshold voltages Vth1(NT5) of N-channel MOS transistors NT5, respectively. Since threshold voltage Vth1(NT5) of N-channel MOS transistor NT5 included in level detector 17 is larger than a threshold voltage Vth2(NT5) of N-channel MOS transistor NT5 included in level detector 19, detection level DL1 of level detector 17 is higher than detection level DL2 of level detector 19.

The detection level DL1 is near the set potential on node N1.

Response times t1 and t2 after level detectors 17 and 19 detect increase of potential VPP on node N1 to detection levels DL1 and DL2 and before they issue activated detection signals SS and SF depend on magnitudes of through-currents flowing through N-channel MOS transistors NT6 and NT7, respectively. N-channel MOS transistors NT6 and NT7 included in level detector 17 have gate lengths longer than those of N-channel MOS transistors NT6 and NT7 included in level detector 19, and N-channel MOS transistors NT6 and NT7 included in level detector 17 have gate widths shorter than those of N-channel MOS transistors NT6 and NT7 included in level detector 19. Therefore, the magnitudes of through-currents flowing through N-channel MOS transistors NT6 and NT7 included in level detector 17 are smaller than the magnitudes of through-currents flowing through N-channel MOS transistors NT6 and NT7 included in level detector 19, and response time t1 of level detector 17 is longer than response time t2 of level detector 19.

For stable operation, level detectors 17 and 19 are supplied from constant voltage generating circuit 24 with constant analog voltage BS which is higher than threshold voltages of N-channel MOS transistors NT6 and NT7 and is lower than power supply voltage Vcc.

An operation of the semiconductor integrated circuit according to the embodiment 1 will be described below.

In the following description, it is assumed that charge pump 23 has a current supply capacity Q1 per period.

Figure 5:
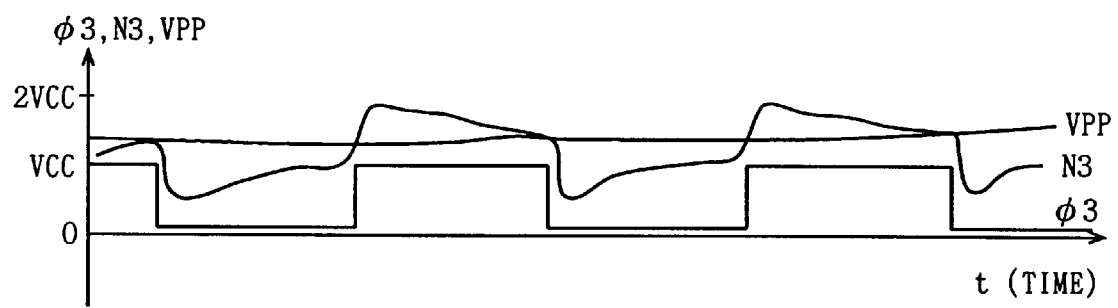
FIG. 5 is a timing chart showing an operation of the circuit shown in FIG. 3.

When potential VPP on node N1 is lower than detection level DL1, and charges which are lost per time are smaller than Q1/T1 owing to a small operation current of internal circuits (not shown), level detector 17 sends detection signal SS at the high level, so that ring oscillator 25 having period T1 starts oscillation. At this time, detection signal SF issued from level detector 19 is at low level, so that clocked inverter CINV2 is deactivated, and clocked inverter CINV1 is activated. Therefore, an output signal OSC1 of ring oscillator 25 is sent as signal SR to charge pump 23 through inverter INV17. Thereby, charge pump 23 supplies a current to the internal circuits (not shown) through node N1 with current supply capacity Q1/T1 per time and period T1. The operation of charge pump 23 is shown in the timing chart of FIG. 5.

When the operation current of internal circuits (not shown) increases, charges which are lost per time increase, so that the above current supply capacity Q1/T1 can maintain the set voltage no longer, and the potential VPP on node N1 lowers. Thereby, level detector 19 having detection level DL2 lower than detection level DL1 of level detector 17 detects the lowering of potential VPP on node N1, and issues detection signal SF at the high level.

Thereby, ring oscillator 27 in composite ring oscillator 21 is activated, and ring oscillator 27 having period T2 starts oscillation.

At this time, clocked inverter CINV1 is deactivated, and clocked inverter CINV2 is activated, so that output signal OSC2 issued from ring oscillator 27 having period T2 is sent as signal SR from inverter INV17 to charge pump 23. Charge pump 23 supplies a current to the internal circuits shown) through node N1 with Q1/T1 per time.

Description will now be given on the operation during restoring of potential VPP on node N1 with reference to timing charts of FIGS. 6A–6F.

When potential VPP on node N1 is lower than detection level DL2, output signal OSC2 sent from ring oscillator 27 having period T2 drives charge pump 23 as shown in FIGS. 6C and 6F. When potential VPP reaches detection level DL2, detection signal SF issued from level detector 19 attains the low level after elapsing of time t2 as shown in FIG. 6B.

Thereby, ring oscillator 27 is deactivated to stop its oscillation. At the same time, clocked inverter CINV2 is deactivated, and clocked inverter CINV1 is activated.

When potential VPP on node N1 is equal to or lower than detection level DL1, the detection signal SS sent from level detector 17 is at the high level as shown in FIG. 6D, and the ring oscillator 25 is active.

Therefore, when detection signal SF sent from level detector 27 attains the low level as shown in FIG. 6F, output signal OSC1 sent from ring oscillator 25 is immediately supplied as signal SR to charge pump 23 through inverter INV17, so that the charge pump 23 is driven.

Thereby, charge pump 23 supplies a current to the internal circuits (not shown) with current supply capacity Q1/T1 per time and period T1.

When potential VPP on node N1 reaches detection level DL1, level detector 17 sets detection signal SS to the low level after elapsing of response time t1 as shown in FIGS. 6D, 6E and 6F, and ring oscillator 25 and charge pump 23 are deactivated.

According to the semiconductor integrated circuit of the embodiment 1 of the invention, as described above, charge pump 23 is commonly used by two ring oscillators 25 and 27, so that it is possible to reduce an area occupied by the power supply circuit system, and the area of the semiconductor chip can be reduced.

Since ring oscillator 25 having long oscillation period T1 continues oscillation without driving the external circuits even while ring oscillator 27 having short oscillation period T2 is driving charge pump 23, it is possible to perform rapid switching from the driving of charge pump 23 by ring oscillator 27 to the driving of charge pump 23 by ring oscillator 25, and therefore rapid restoring to the set boosted voltage can be performed.

Description will now be given on a specific extent to which an area occupied by the power supply circuit system is reduced.

In general, an area occupied by a circuit depends on an area occupied by interconnections required in the circuit, or depends on an area occupied by elements required in the circuit. In the case of the charge pump, the occupied area depends on an area occupied by capacitors C1–C3 shown in FIG. 3. An area S occupied by the capacitor can be generally expressed as S=tox·C/εox, when an oxide film has a dielectric constant of sox and a thickness of tox, and the capacitor has a capacity C. For example, when εox is 3.45E–11 (F/m), tox is 9 (nm) and C is 280 pF+6 pF+6 pF=292pF, the obtained occupied area S is equal to 7.62E–8 (m²) (nearly 276 μm×276 μm). Meanwhile, the power supply circuit is allowed to occupy an area of up to about 500 μm×500 μm in the semiconductor integrated circuit. Therefore, it can be understood that the occupied area is reduced by (276 μm×276 μm)/(500 μm×5000 μm)=0.035=3.5%.

[Embodiment 2]

Although the semiconductor integrated circuit provided with the boosted power supply circuit system has been discussed as the embodiment 1, the same consideration may be applied to a semiconductor integrated circuit provided with a circuit system (which will be referred to as a "negative voltage power supply circuit system") which generates a negative voltage lower than the ground voltage and holds the potential on the semiconductor substrate at the set negative voltage.

Figure 7:
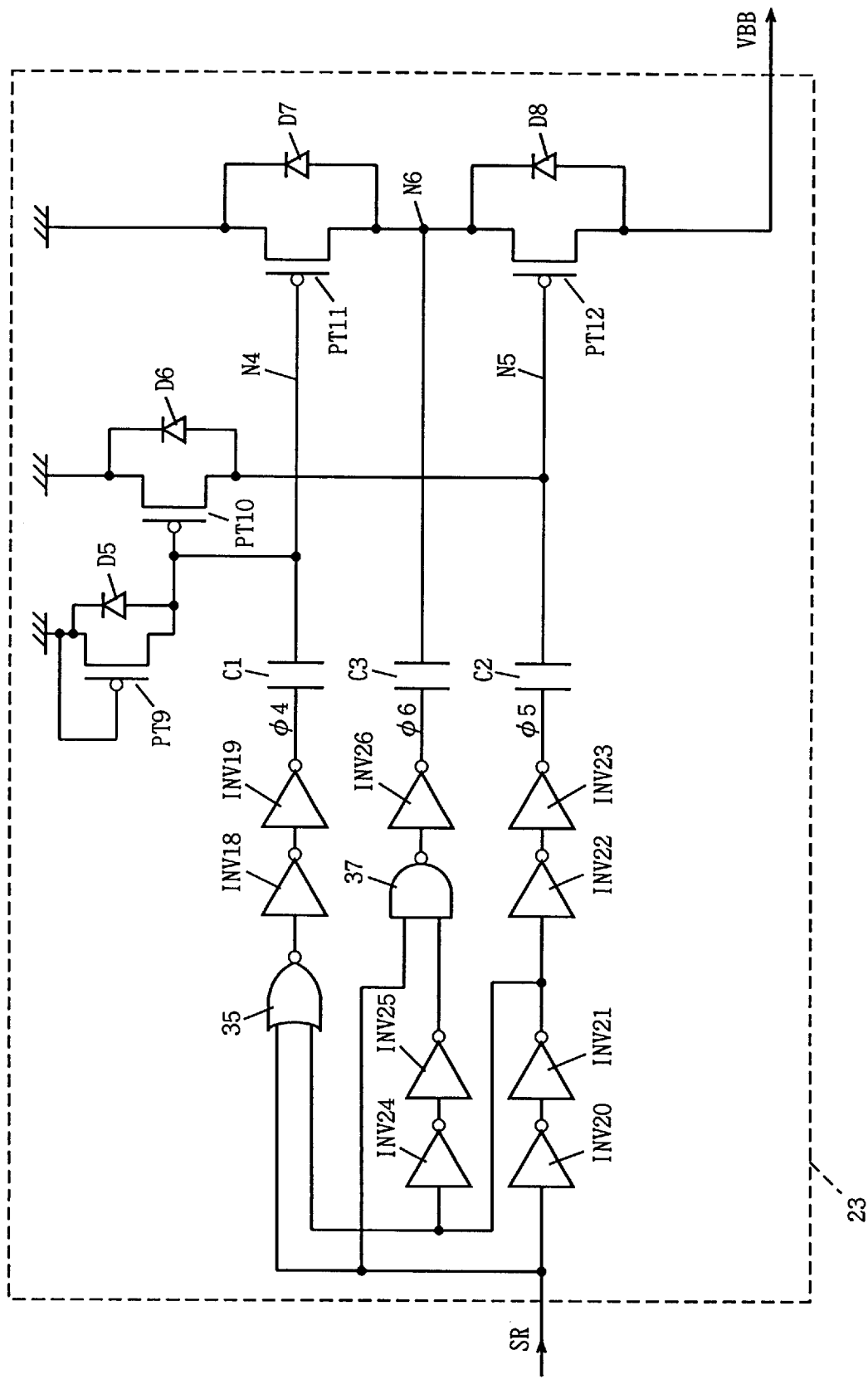
FIG. 7 is a circuit diagram showing a structure of a charge pump shown in FIG. 1 in a negative voltage power supply circuit system.

More specifically, the semiconductor integrated circuit according to the embodiment 2 includes a negative voltage power supply circuit system having the structure shown in FIG. 1. FIG. 7 is a circuit diagram showing a structure of charge pump 23 in this negative voltage power supply circuit system.

Figure 8:
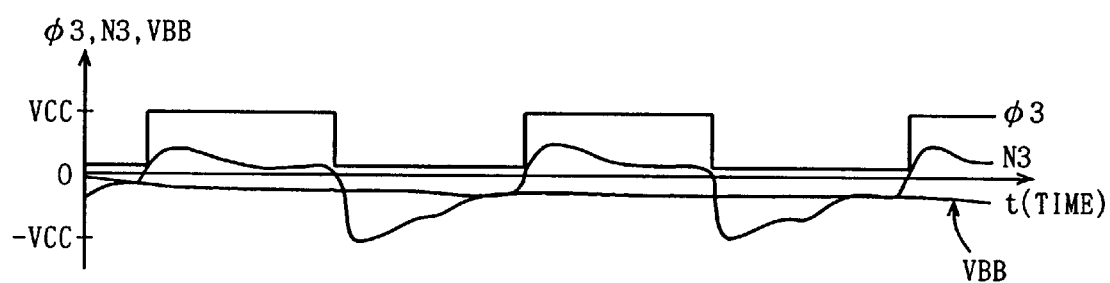
FIG. 8 is a timing chart showing an operation of the circuit shown in FIG. 7.

As shown in FIG. 7, this charge pump includes an NOR circuit 35, an NAND circuit 37, inverters INV19–INV26, capacitors C1–C3, diodes D5–D8 and P-channel MOS transistors PT9–PT12. Operations thereof are shown in a timing chart of FIG. 8.

Figure 9:
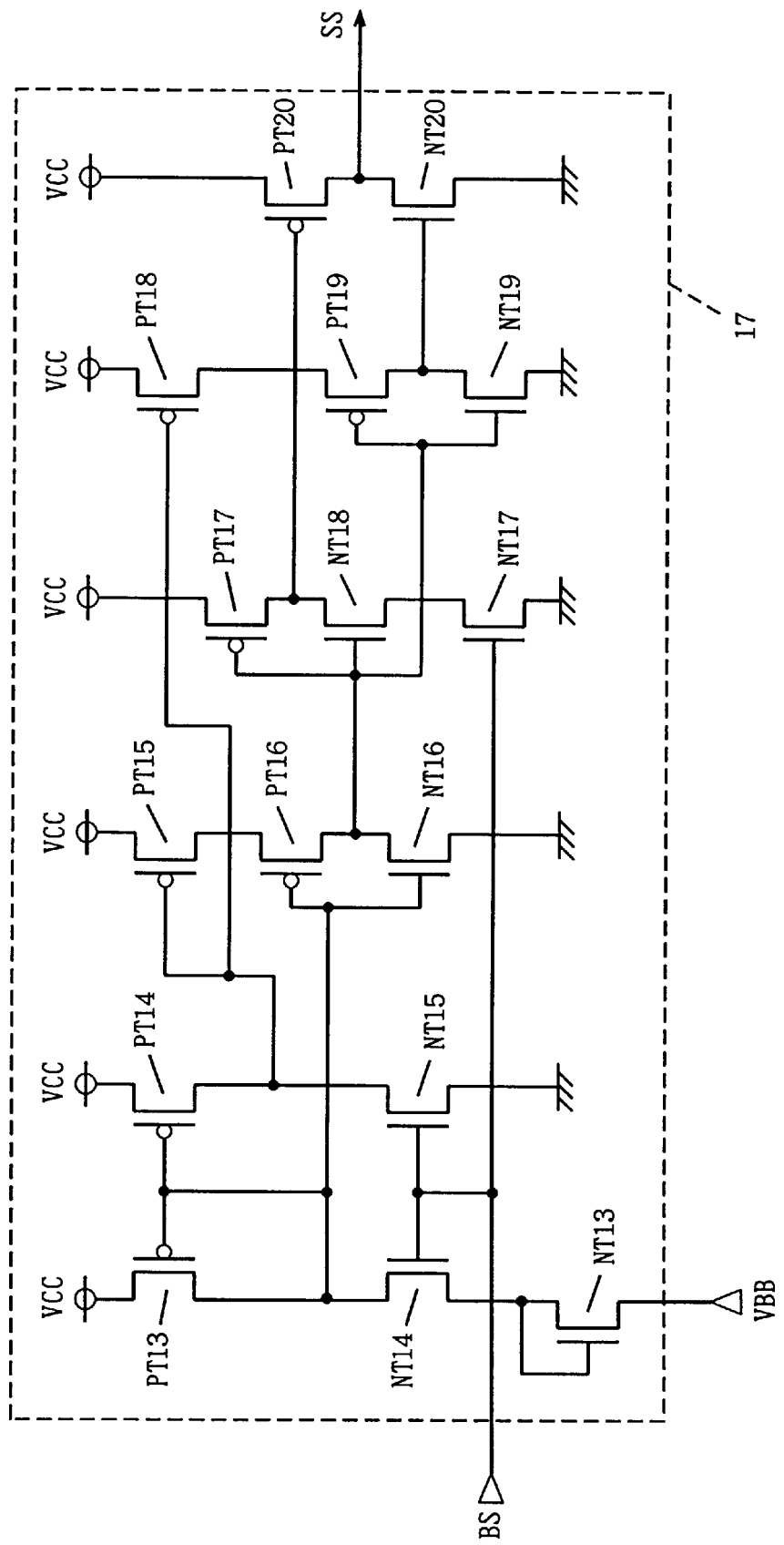
FIG. 9 is a circuit diagram showing a structure of a level detector shown in FIG. 1 in the negative voltage power supply circuit system.

FIG. 9 is a circuit diagram showing a specific structure of level detector 17 in the negative voltage power supply circuit system of the embodiment 2 shown in FIG. 1.

Although level detector 19 has the same circuit structure as the level detector 17, the detection level of level detector 19 is higher than the detection level of level detector 17 owing to difference between threshold voltages Vth(NT13) of N-channel MOS transistors NT13.

An operation of the semiconductor integrated circuit according to the embodiment 2 will be described below.

When the operation current is small, and the charges due to a small number of carriers discharged into the substrate per time are smaller than Q1/T1, level detector 17 supplies detection signal SS at the high level to composite ring oscillator 21, and ring oscillator 25 having period T1 starts oscillation. At this time, detection signal SF issued from level detector 19 is at the low level, sop that clocked inverter CINV1 is activated, and clocked inverter CINV2 is deactivated. Therefore, output signal OSC1 issued from ring oscillator 25 is supplied as signal SR to charge pump 23 through inverter INV17. Charge pump 23 performs the current supply with current supply capacity Q1/T1 per time and period T1.

When the operation current further increases, the charges due to a small number of carriers discharged into the substrate per time increase, so that current supply capacity Q1/T1 cannot maintain the set voltage, and the internal voltage rises toward the ground potential. Thereby, level detector 19 detects rising of the negative voltage with a predetermined detection level, and supplies detection signal SF at the high level to composite ring oscillator 21.

Thereby, ring oscillator 27 starts oscillation. Also, clocked inverter CINV1 is deactivated, and clocked inverter CINV2 is activated.

Thereby, output signal OSC2 of ring oscillator 27 having period T2 is supplied as signal SR to charge pump 23 through inverter INV17, and charge pump 23 performs the current supply with current supply capacity Q1/T2 per time and period T2.

When substrate voltage VBB is restored to the detection level of level detector 19 owing to the current supply with current supply capacity Q1/T1 per time and period T2, level detector 19 supplies detection signal SF at the low level to composite ring oscillator 21. Thereby, clocked inverter CINV1 is activated, and clocked inverter CINV2 is deactivated, so that output signal OSC1 of the ring oscillator having period T1 is supplied as signal SR to charge pump 23 from inverter INV17.

Charge pump 23 performs the current supply with current supply capacity Q1/T1 per time and period T1, whereby restoring to the set negative voltage is performed. Ring oscillator 27 stops oscillation in response to the fact that detection signal SF sent to composite ring oscillator 21 attains the low level.

According to the semiconductor integrated circuit of the embodiment 2, charge pump 23 is commonly used by ring oscillators 25 and 27, so that the area occupied by the negative voltage power supply current system is reduced, and thus the semiconductor chip area can be reduced.

Restoring to the set negative voltage ultimately requires the current supply with current supply capacity Q1/T1 per time and period T1. In connection with this, ring oscillator 25 which oscillates with period T1 continues oscillation without driving the external circuit even while ring oscillator 27 which oscillates with period T2 is driving charge pump 23. Therefore, switching from driving of charge pump 23 by ring oscillator 27 to driving of charge pump 23 by ring oscillator 25 can be performed rapidly, and restoring to the set negative voltage can be performed rapidly.

The power supply circuit systems according to the embodiments 1 and 2 are provided for maintaining and restoring the predetermined power supply voltage principally during operation of the internal circuits (not shown). However, the same consideration may be applied to circuit systems of which purpose is to maintain and restore the predetermined power supply voltage during standby of the internal circuits. The same is true with respect to power supply circuit systems according to the embodiments which will be described below.

[Embodiment 3]

A semiconductor integrated circuit according to an embodiment 3 of the invention includes a power supply circuit system similar to that employed in the semiconductor integrated circuit according to the embodiment 1 or 2. However, this power supply circuit system has a structure different from that of composite ring oscillator 21 shown in FIG. 1.

Figure 10:
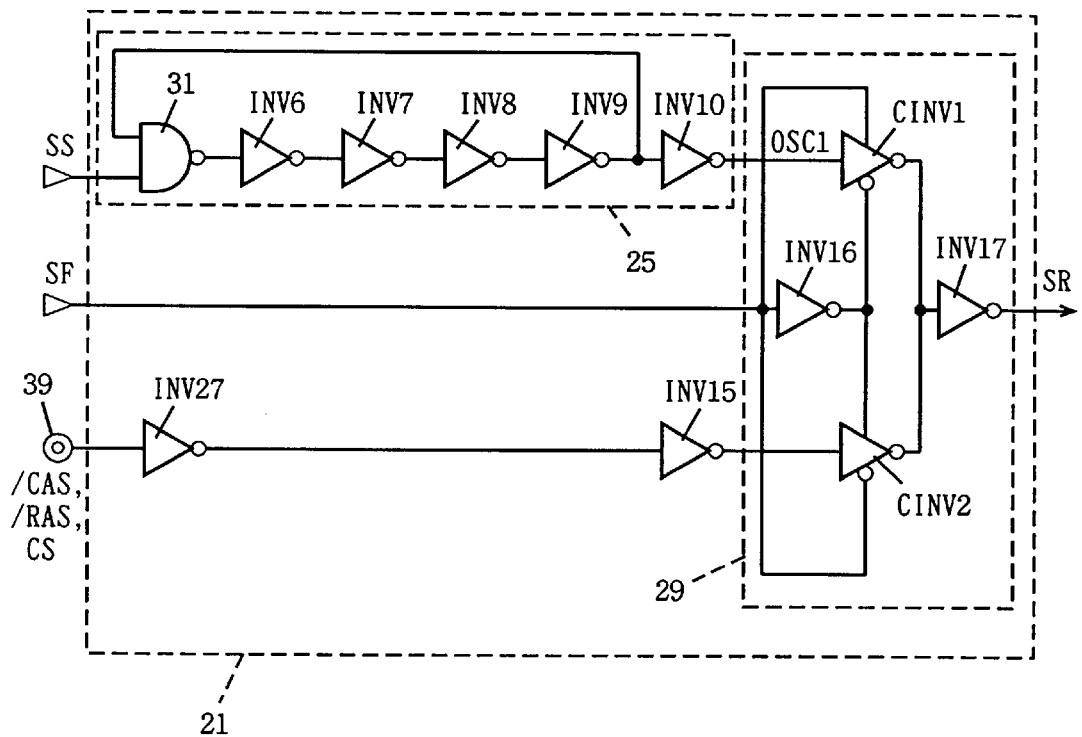
FIG. 10 is a circuit diagram showing a structure of a composite ring oscillator in a semiconductor integrated circuit according to an embodiment 3 of the invention.

FIG. 10 is a circuit diagram showing a specific structure of a composite ring oscillator of the power supply circuit system according to the embodiment 3.

As shown in FIG. 10, the composite ring oscillator includes ring oscillator 25, select circuit 29 and inverter INV15, similarly to that shown in FIG. 2, and further includes an inverter INV27 connected to inverter INV15 and an external terminal 39 connected to inverter INV27.

External terminal 39 is supplied with external control signals such as a column address strobe signal/CAS, a row address strobe signal/RAS and a chip select signal CS for controlling an operation of the semiconductor integrated circuit.

The operation of the semiconductor integrated circuit according to the embodiment 3 will be described below in connection with such a case that the power supply circuit system is a boosted power supply circuit system. The same discussion can be applied to a negative voltage power supply circuit system.

When the operation current is small, and the charges which are lost per time is smaller than Q1/T1, level detector 17 supplies detection signal SS at the high level to composite ring oscillator 21, and ring oscillator 25 oscillating with period T1 is activated. At this time, detection signal SF issued from level detector 19 is at the low level, so that clocked inverter CINV2 is deactivated, and clocked inverter CINV1 is activated. Therefore, output signal OSC1 of ring oscillator 25 is sent as signal SR to charge pump 23 through inverter INV17, and charge pump 23 performs the current supply with current supply capacity Q1/T1 per time and period T1.

When the operation current further increases and therefore charges which are lost per time increase, current supply capacity Q1/T1 cannot maintain the set voltage, and the boosted voltage lowers. Thereby, level detector 19 detects lowering of the boosted voltage with the predetermined detection level, and supplies detection signal SF at the high level to composite ring oscillator 21. Thereby, clocked inverter CINV1 is activated, and clocked inverter INV2 is activated, so that an external control signal supplied to external terminal 39 is supplied as signal SR to charge pump 23 through inverter INV17. Assuming that the external control signal has a period of T3, charge pump 23 performs the current supply with current supply capacity Q1/T3 per time and period T3.

When the boosted voltage is restored to the detection level of level detector 19 owing to the current supply with current supply capacity Q1/T3 per time and period T3, level detector 19 supplies detection signal SF at the low level to composite ring oscillator 21. Thereby, clocked inverter CINV2 is deactivated, and clocked inverter CINV1 is activated, so that output signal OSC1 of ring oscillator 25 with period T1 is immediately supplied to charge pump 23 through inverter INV17. Charge pump 23 performs the current supply with current supply capacity Q1/T1 per time and period T1, so that restoration to the set voltage is performed.

According to the semiconductor integrated circuit of the embodiment 3, as described above, charge pump 23 is commonly used for the two signals, i.e., output signal OSC1 of ring oscillator 25 and the external control signal supplied to external terminal 39. Therefore, an area occupied by the power supply circuit system is reduced, and thus an area of the semiconductor chip can be reduced.

Restoring to the set boosted voltage ultimately requires the current supply with current supply capacity Q1/T1 per time and period T1. In connection with this, ring oscillator 25 continues oscillation without driving the external circuit even while the external control signal of period T3 is driving charge pump 23. Therefore, switching from the driving of charge pump 23 with the internal control signal having period T3 to the driving of charge pump 23 with output signal OSC1 of period T1 can be rapidly performed, and therefore rapid restoring to the set boosted voltage can be performed.

[Embodiment 4]

A semiconductor integrated circuit according to the embodiment 4 has the same structure as that of the embodiment 3 except for the structure of composite ring oscillator 21.

Figure 11:
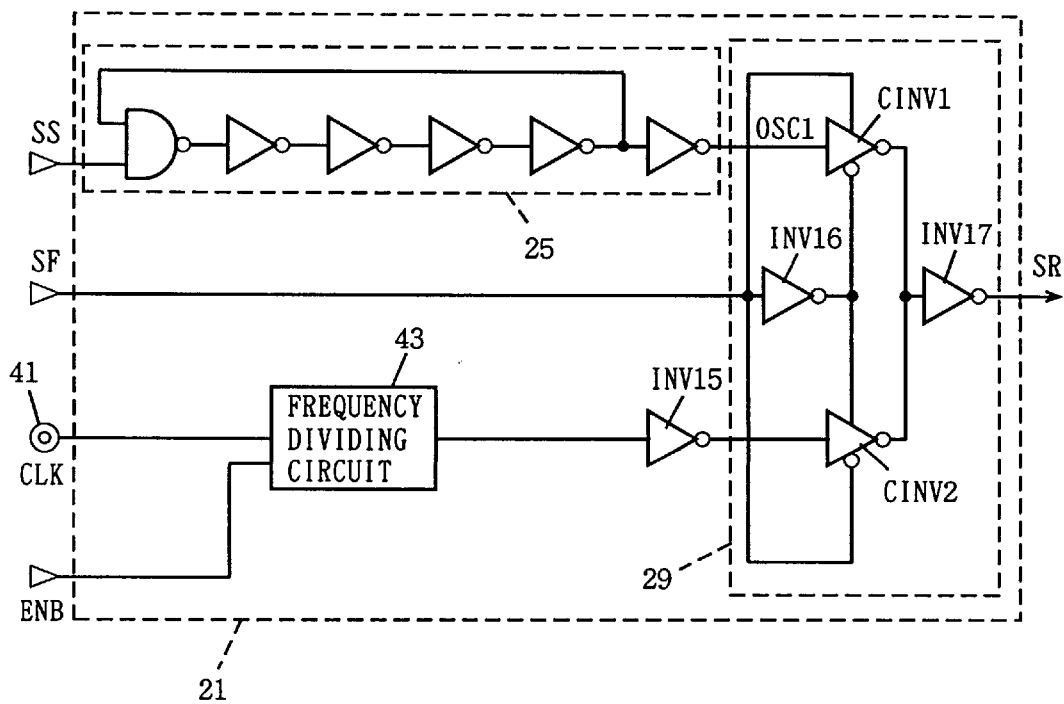
FIG. 11 shows a structure of a composite ring oscillator in a semiconductor integrated circuit according to an embodiment 4 of the invention.

Composite ring oscillator 21 of the embodiment 4 includes, as shown in FIG. 11, a frequency dividing circuit 43 connected to inverter 15 and an external terminal 41 supplied with external clock signal CLK instead of external terminal 39 and inverter INV27 employed in composite ring oscillator 21 of the embodiment 3.

Frequency dividing circuit 43 is employed because external clock signal CLK has an excessively short period and therefore is not suitable as a signal for driving charge pump 23.

External clock signal CLK may be a signal which is used, e.g., for control of a synchronous semiconductor memory device.

Figure 12:
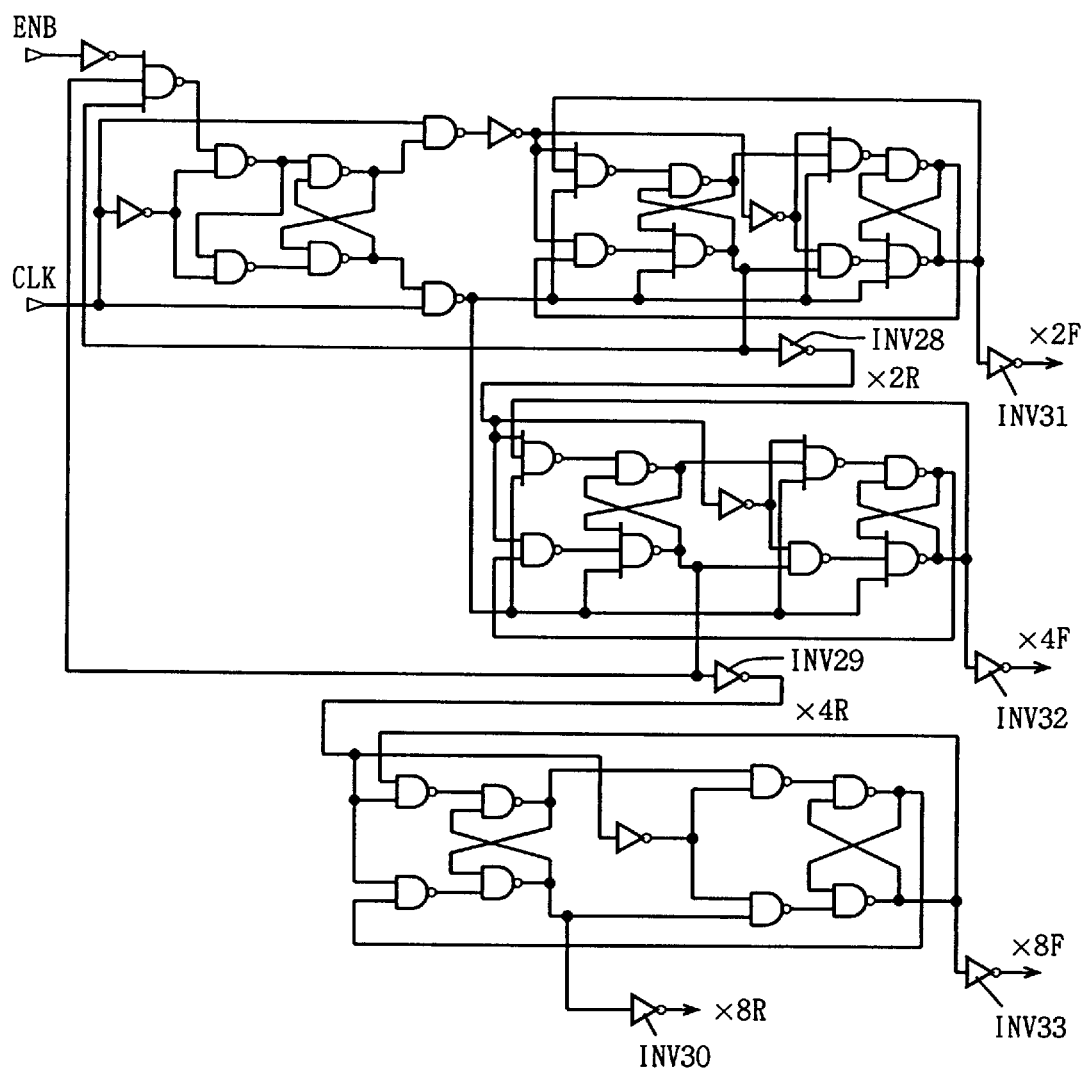
FIG. 12 is a circuit diagram showing a structure of a frequency-dividing circuit shown in FIG. 11.

FIG. 12 is a circuit diagram showing a specific structure of frequency dividing circuit 43. As shown in FIG. 12, frequency dividing circuit 43 is activated when it is supplied with a signal ENB at the high level, and thereby effects the frequency dividing on received external clock signal CLK.

Figure 13:
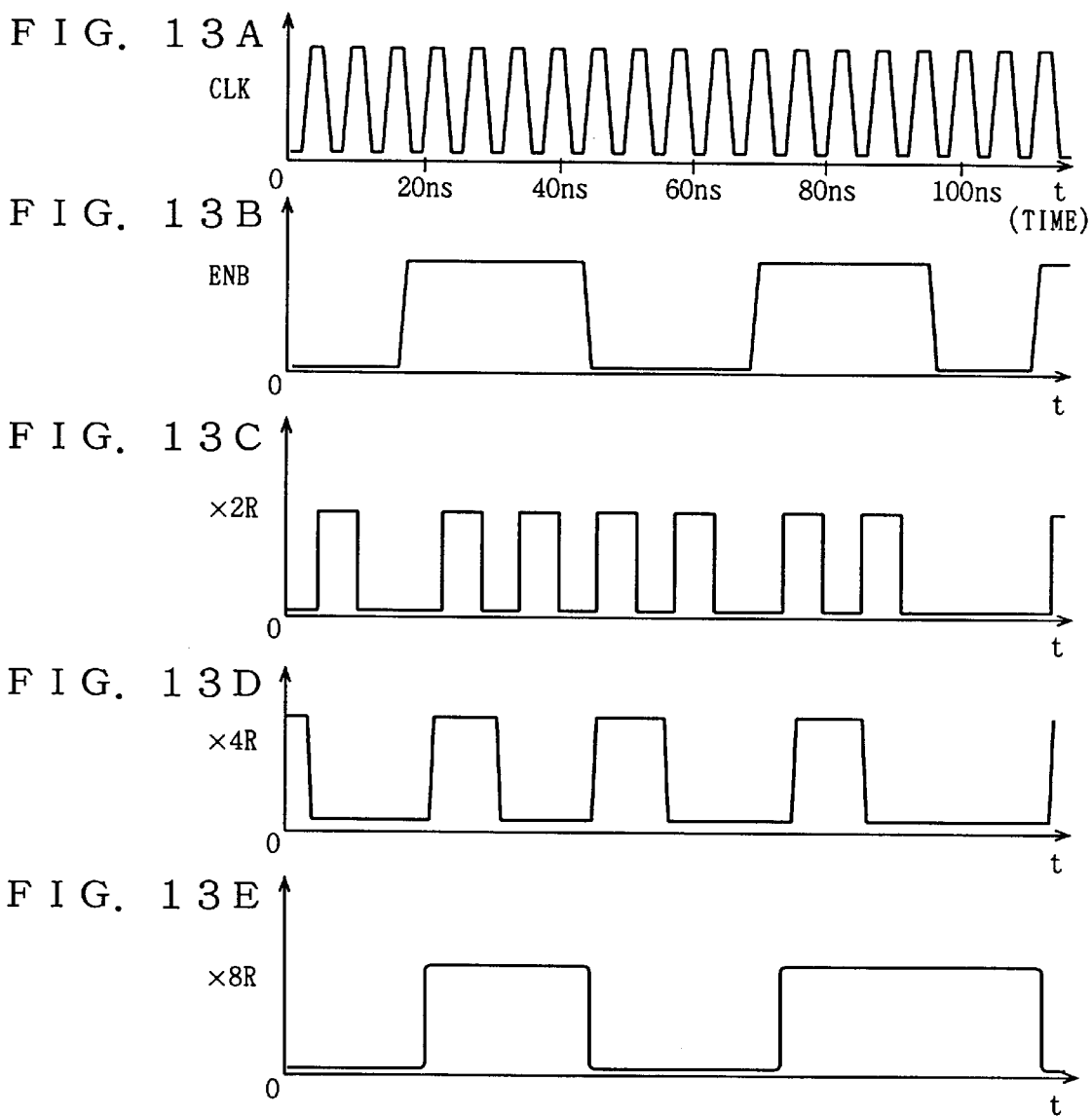
FIGS. 13A–13E are timing charts showing operations of the circuit shown in FIG. 12.
Figure 14:
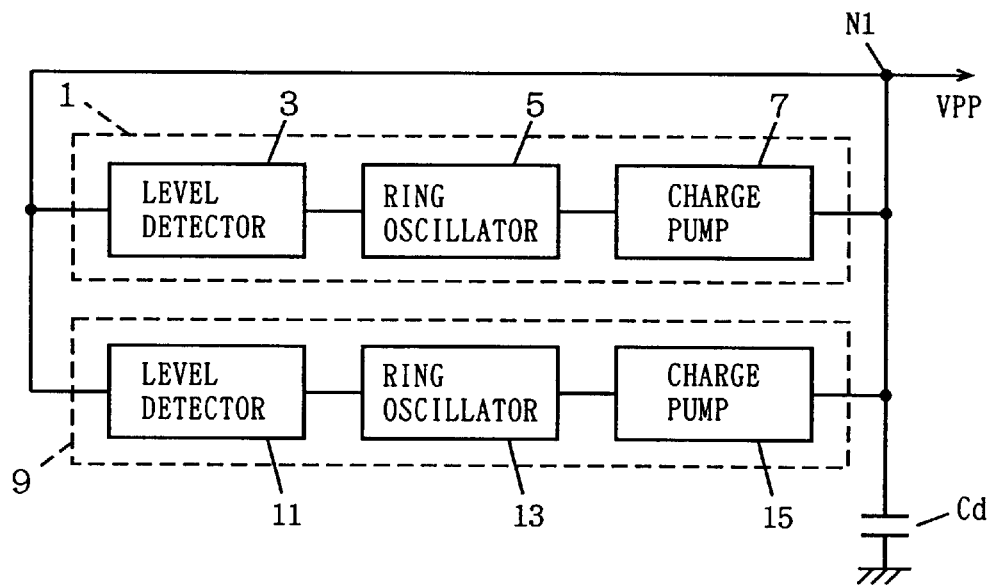
FIG. 14 shows a structure of a boosted power supply circuit in a semiconductor integrated circuit in the prior art.
Figure 15:
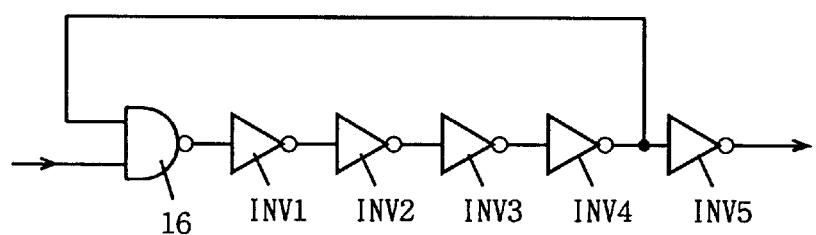
FIG. 15 is a circuit diagram showing a structure of a ring oscillator shown in FIG. 14.

FIGS. 13A–13E are timing charts showing an operation of frequency dividing circuit 43. As shown in FIGS. 13C–13E, inverters INV28, INV29 and INV30 issue signals X2R, X4R and X8R by dividing the frequency of external clock signal CLK by 2, 4 and 8. Depending on the specific purpose, one of output nodes of inverters INV28, INV29 and INV30 is connected to the input node of inverter INV15. Signals X2R, X4R and X8R issued from inverters INV28, INV29 and INV30 are produced based on the timing at which external clock signal CLK attains the high level. Likewise, inverters INV31, INV32 and INV33 issue signals X2F, X4F and X8F, respectively, which are produced based on the timing at which external clock signal CLK attains the low level. Therefore, a similar effect can be achieved by connecting one of output nodes of these inverters INV31, INV32 and INV33 to the input node of inverter INV15.

An operation of a boosted power supply circuit system will be described below as an example of an operation of the power supply circuit system of the semiconductor integrated circuit according to the embodiment 4. An operation of a negative voltage power supply circuit system can be discussed in a similar manner.

When an operation current is small, and charges which are lost per time are smaller than Q1/T1, detection signal SS at the high level is supplied from level detector 17 to composite ring oscillator 21, and ring oscillator 25 starts oscillation with period T1. At this time, detection signal SF issued from level detector 19 is at the low level, so that clocked inverter CINV2 is deactivated, and clocked inverter CINV1 is activated. Therefore, output signal OSC1 of ring oscillator 25 is supplied as signal SR to charge pump 23. Charge pump 23 performs the current supply with current supply capacity Q1/T1 per time and period T1.

When the operation current increases, charges which are lost per time increase, so that current supply capacity Q1/T1 cannot maintain the set voltage, and the boosted voltage lowers. Thereby, level detector 19 detects lowering of the boosted voltage with the predetermined detection level, and supplies detection signal SF at the high level to composite ring oscillator 21. Thereby, clocked inverter CINV1 is deactivated, and clocked inverter CINV2 is activated, so that a signal prepared by frequency dividing of external clock signal CLK by frequency dividing circuit 43 is supplied as signal SR to charge pump 23 through inverter INV17. Assuming that this frequency-divided signal has a period of T4, charge pump 23 performs the current supply with current supply capacity Q1/T4 per time.

When the boosted voltage is restored to the detection level of level detector 19 owing to the current supply with current supply capacity Q1/T4 per time and period T4, level detector 19 supplies detection signal SF at the low level to composite ring oscillator 21.

Thereby, clocked inverter CINV2 is deactivated, and clocked inverter CINV1 is activated, so that output signal OSC1 of ring oscillator 25 having period T1 is immediately supplied as signal SR to charge pump 23 through inverter INV17.

Charge pump 23 performs the current supply with current supply capacity Q1/T1 per time and period T1, so that restoration to the set boosted voltage is performed.

Frequency dividing circuit 43 is formed of only logic gates, and therefore an area occupied by the boosted power supply circuit system can be smaller than that in the case where a plurality of charge pumps are employed.

More specifically, frequency dividing circuit 43 includes logical gates of 42 in number, transistors of 164 in number and nodes of 87 in number. Since the occupied area depends on the number of nodes, a width of, for example, a CMOS circuit band of about 70 $\mu$m in height is nearly equal to a product of the pitch of metal interconnections and the number of nodes. Numerically, the width is 1.0 $\mu$m×87=87 $\mu$m, and the occupied area is 70 $\mu$m×87 $\mu$m=6090 $\mu$m$^2$.

According to the semiconductor integrated circuit of the embodiment 4, as described above, charge pump 23 is commonly used, so that an area occupied by the power supply circuit system is reduced, and thus the semiconductor chip area can be reduced.

Although restoration to the set boosted voltage ultimately requires the current supply with current supply capacity Q1/T1 and period T1, ring oscillator 25 continues oscillation without driving the external circuit even while the frequency-divided signal of period T4 is driving charge pump 23. Therefore, switching from the driving of charge pump 23 with the frequency-divided signal of period T4 to the driving of charge pump 23 with output signal OSC1 of ring oscillator 25 with period T1 can be rapidly performed, so that rapid restoration to the set boosted voltage is allowed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
    an internal voltage generating circuit for generating an internal voltage based on an external voltage in response to one of a plurality of periodic signals;
    a plurality of detecting circuits respectively corresponding to different predetermined detection levels that are in ascending order of magnitude, each of said detecting circuits being operable to issue a detection signal when said internal voltage issued from said internal voltage generating circuit reaches the corresponding predetermined detection level;
    a plurality of periodic signal supply circuits provided correspondingly to said plurality of detecting circuits for issuing said periodic signals having different frequencies, respectively; and
    a selecting circuit, in accordance with said detection signals, for selectively supplying said internal voltage generating circuit with a periodic signal of lower frequency from among said periodic signals as said internal voltage approaches a target level.

2. The semiconductor integrated circuit according to claim 1, wherein
    at least one of said plurality of periodic signal supply circuits includes an external terminal supplied with an external control signal.

3. The semiconductor integrated circuit according to claim 2, wherein
    each of the others of said periodic signal supply circuits switches from an active state to an inactive state in response to said detection signal issued from a corresponding one of said detecting circuits.

4. The semiconductor integrated circuit according to claim 3, wherein
    said internal voltage is higher than an external power supply voltage.

5. The semiconductor integrated circuit according to claim 3, wherein
    said internal voltage is lower than a ground voltage.

6. The semiconductor integrated circuit according to claim 2, wherein
    said internal voltage is higher than an external power supply voltage.

7. The semiconductor integrated circuit according to claim 2, wherein
    said internal voltage is lower than a ground voltage.

8. The semiconductor integrated circuit according to claim 1, wherein
    at least one of said plurality of periodic signal supply circuits includes:
    an external terminal supplied with an external clock signal, and
    a frequency divider connected to said external terminal for frequency-dividing said external clock signal.

9. The semiconductor integrated circuit according to claim 8, wherein
    each of the others of said periodic signal supply circuits switches from an active state to an inactive state in response to said detection signal issued from a corresponding one of said detecting circuits.

10. The semiconductor integrated circuit according to claim 9, wherein
    said internal voltage is higher than an external power supply voltage.

11. The semiconductor integrated circuit according to claim 9, wherein
    said internal voltage is lower than a ground voltage.

12. The semiconductor integrated circuit according to claim 8, wherein
    said internal voltage is higher than an external power supply voltage.

13. The semiconductor integrated circuit according to claim 8, wherein
    said internal voltage is lower than a ground voltage.

14. The semiconductor integrated circuit according to claim 1, wherein
    each of said periodic signal supply circuits switches from an active state to an inactive state in response to said detection signal issued from a corresponding one of said detecting circuits.

15. The semiconductor integrated circuit according to claim 14, wherein said internal voltage is higher than an external power supply voltage.

16. The semiconductor integrated circuit according to claim 14, wherein said internal voltage is lower than a ground voltage.

17. The semiconductor integrated circuit according to claim 1, wherein said internal voltage is higher than an external power supply voltage.

18. The semiconductor integrated circuit according to claim 1, wherein said internal voltage is lower than a ground voltage.

\* \* \* \* \*